United States Patent
Chu et al.

(10) Patent No.: US 7,348,778 B2
(45) Date of Patent: Mar. 25, 2008

(54) SYSTEM AND APPARATUS FOR A HIGH RESOLUTION PERIPHERAL VASCULAR COIL ARRAY

(75) Inventors: Dashen Chu, Hartland, WI (US); Ricardo Marcal Matias, Gainesville, FL (US); Robert Steven Stormont, Hartland, WI (US); Fraser R. L. Robb, Aurora, OH (US)

(73) Assignee: General Electric Company, Schenectady, NY (US)

( * ) Notice: Subject to any disclaimer, the term of this patent is extended or adjusted under 35 U.S.C. 154(b) by 34 days.

(21) Appl. No.: 10/908,490

(22) Filed: May 13, 2005

(65) Prior Publication Data

US 2006/0255803 A1    Nov. 16, 2006

(51) Int. Cl.
*G01V 3/00* (2006.01)
(52) U.S. Cl. ...................................................... 324/318
(58) Field of Classification Search ........ 324/300–322; 600/410–435; 333/219–235; 343/703, 718, 343/720, 725–730, 741–744, 787–788, 793–831, 343/866–871, 893, 907–916
See application file for complete search history.

(56) References Cited

U.S. PATENT DOCUMENTS

| | | | | |
|---|---|---|---|---|
| 4,825,162 A | | 4/1989 | Roemer et al. ............. | 324/318 |
| 5,394,087 A | * | 2/1995 | Molyneaux ................. | 324/318 |
| 5,682,098 A | * | 10/1997 | Vij ............................. | 324/318 |
| 5,929,639 A | * | 7/1999 | Doty ........................... | 324/318 |
| 5,951,474 A | * | 9/1999 | Matsunaga et al. ........ | 600/422 |
| 6,137,291 A | * | 10/2000 | Szumowski et al. ....... | 324/318 |
| 6,300,761 B1 | * | 10/2001 | Hagen et al. ............... | 324/318 |
| 6,323,648 B1 | | 11/2001 | Belt et al. .................. | 324/322 |
| 6,624,633 B1 | * | 9/2003 | Zou et al. ................... | 324/318 |
| 6,750,653 B1 | * | 6/2004 | Zou et al. ................... | 324/318 |
| 6,784,665 B1 | * | 8/2004 | Chan et al. ................. | 324/318 |
| 6,954,069 B2 | * | 10/2005 | Harvey et al. .............. | 324/318 |
| 7,221,161 B2 | * | 5/2007 | Fujita et al. ................ | 324/318 |
| 2004/0183534 A1 | * | 9/2004 | Chan et al. ................. | 324/318 |
| 2005/0030022 A1 | * | 2/2005 | Robb et al. ................. | 324/306 |
| 2005/0107686 A1 | * | 5/2005 | Chan et al. ................. | 600/422 |
| 2006/0255804 A1 | * | 11/2006 | Chu et al. ................... | 324/318 |

* cited by examiner

*Primary Examiner*—Brij Shrivastav
*Assistant Examiner*—Dixomara Vargas
(74) *Attorney, Agent, or Firm*—Cantor Colburn LLP

(57) ABSTRACT

A peripheral vascular coil array for providing images of a region of interest includes a first section including a first coil array and a second coil array in electrical communication with each other. The first and second coil arrays are disposed at opposite sides of the region of interest to produce a magnetic field in the region of interest. Each of the first and second coil arrays includes a butterfly coil and a loop coil.

18 Claims, 8 Drawing Sheets

SYSTEM AND APPARATUS FOR A HIGH RESOLUTION PERIPHERAL VASCULAR COIL ARRAY

BACKGROUND OF THE INVENTION

The present disclosure relates to an imaging system. More particularly, the present disclosure to a high resolution coil array for a magnetic resonance imaging system.

Conventionally, magnetic resonance imaging (MRI) procedures include excitation of selected dipoles within a subject and receiving magnetic resonance signals emanating from the dipoles. In many applications, the magnetic resonance signals are received with whole body radio frequency (RF) coils, i.e. circularly cylindrical RF coils which surround a receiving bore of an MRI apparatus. In other applications, a surface coil is applied to a surface of a patient proximate to a region of interest (ROI) while the patient is located within the receiving bore to receive the magnetic resonance signals.

Various surface coil configurations have been utilized. Simple loop coils, e.g. a simple square or circle, have been utilized to receive the magnetic resonance signals. Loop coils are sensitive to signal components that are perpendicular to the loop coil and insensitive to components in a plane of the loop coil. In order to improve a signal-to-noise ratio (SNR), quadrature surface coils have been utilized to examine a ROI in quadrature, i.e. receive signal components that are perpendicular to the quadrature surface coil and components that are parallel to the quadrature surface coil. However, even these conventional quadrature surface coils produce under resolved images in certain regions of a body, such as, for example, in lower limbs.

In general, magnetic resonance imaging of vessels in the lower limbs has been poor in the past. Close proximity of calf and pedal arteries to a skin surface combined with fine characteristics of vessels in the lower limbs often results in under resolved images of the lower limbs. Orientations of vessels in the lower limbs also create imaging problems since, for example, a patient's feet are oriented in a separate plane than a majority of a body of the patient. Thus, existing commercial RF coils, often produce images of vessels, which are most distal that are of little diagnostic value.

Given the frequency and severity of diseases, for example, diabetes, that may require imaging of the lower limbs, it is desirable to produce a coil array capable of providing a resolution that provides improved images of the lower limbs. Additionally, since many patients having such diseases are aged or in pain, it is desirable to produce a coil array that is not compressive to wounds on the lower limbs.

BRIEF DESCRIPTION OF THE INVENTION

Exemplary embodiments of the invention include a peripheral vascular coil array for providing images of a region of interest. The peripheral vascular coil array comprises a first section including a first coil array and a second coil array in electrical communication with each other. The first and second coil arrays are disposed at opposite sides of the region of interest to produce a magnetic field in the region of interest. Each of the first and second coil arrays includes a butterfly coil and a loop coil.

Further exemplary embodiments of the invention include an imaging system for providing images of a region of interest. The imaging system includes a control system, a magnetic field generating apparatus, a peripheral vascular coil array, and an interface device. The magnetic field generating apparatus generates magnetic field in response to the control system. The peripheral vascular coil array comprises a first section including a first coil array and a second coil array in electrical communication with each other. The first and second coil arrays are disposed at opposite sides of the region of interest to produce a magnetic field in the region of interest. Each of the first and second coil arrays includes a butterfly coil and a loop coil. The interface device provides electrical communication between the peripheral vascular coil array and the control system.

The above, and other objects, features and advantages of the present invention will become apparent from the following description read in conjunction with the accompanying drawings, in which like reference numerals designate the same elements.

BRIEF DESCRIPTION OF THE DRAWINGS

Referring now to the drawings wherein like elements are numbered alike in the several FIGURES.

DETAILED DESCRIPTION OF THE INVENTION

Although the embodiments described hereafter are discussed in reference to application of a coil array to lower body extremities, it should be noted that the present disclosure is not limited to employment with lower body extremities. Rather, the lower body extremities comprise one example of a region of interest (ROI) for which the present disclosure may be employed.

Figure 1:
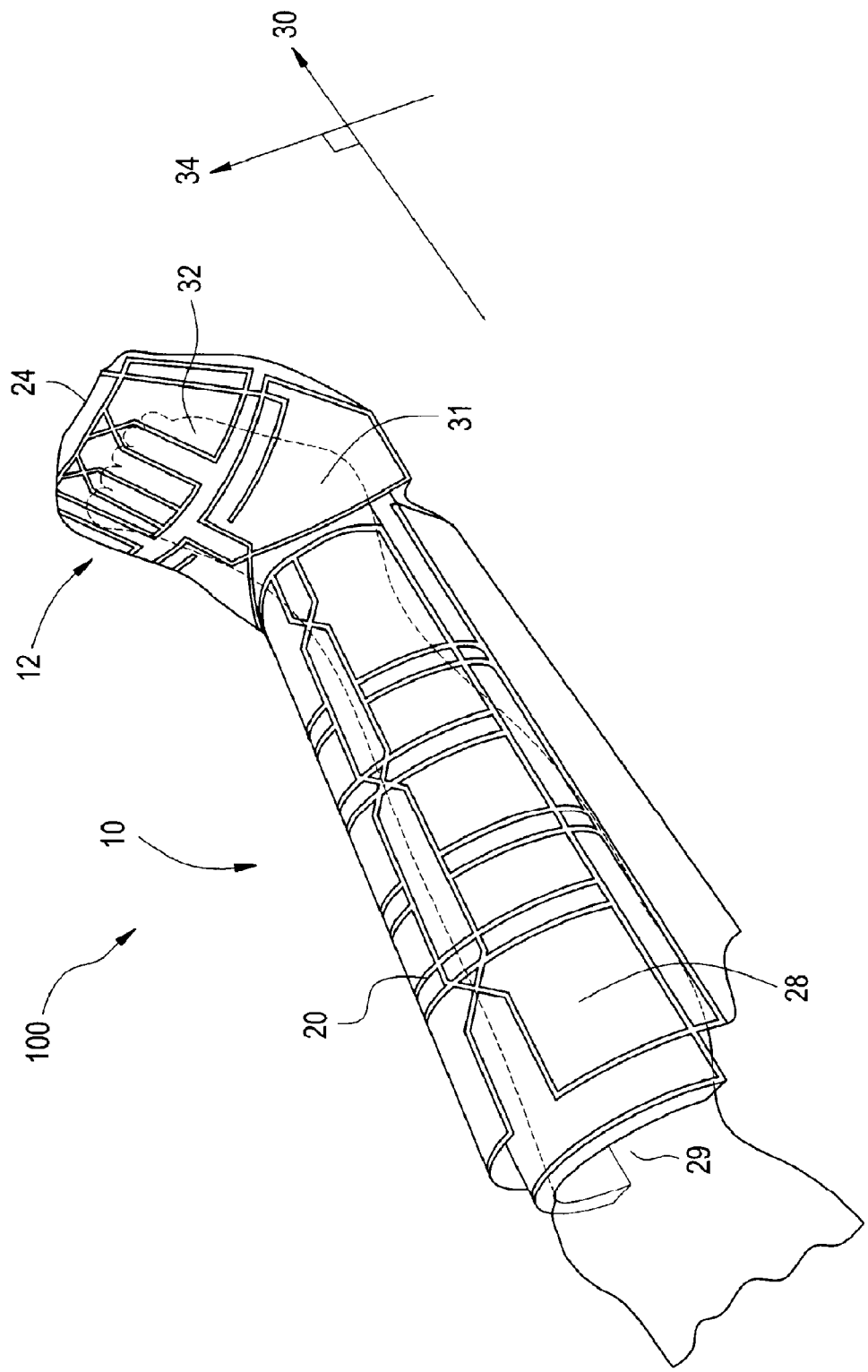
FIG. 1 is a perspective view of an anterior portion and a foot portion of a high resolution peripheral vascular coil array according to an exemplary embodiment.
Figure 2:
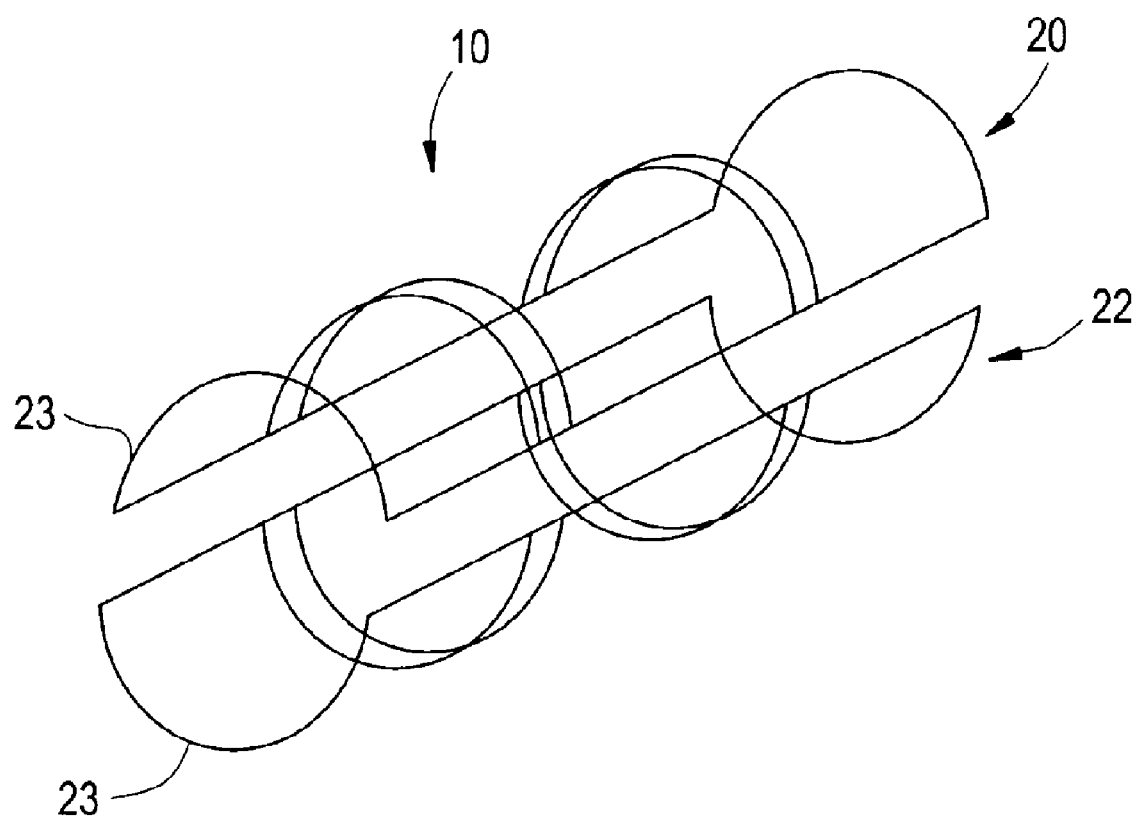
FIG. 2 shows a coil arrangement for a leg portion of a high resolution peripheral vascular coil array according to an exemplary embodiment.

FIG. 1 is a perspective view of an anterior coil array and a foot coil array of a high resolution peripheral vascular coil array according to an exemplary embodiment. FIG. 2 shows a coil arrangement for a leg portion of a high resolution peripheral vascular coil array according to an exemplary embodiment.

Referring now to FIGS. 1 and 2, a high resolution peripheral vascular coil array, or peripheral vascular coil array 100, includes a leg section 10 and a foot section 12. The leg section 10 includes an anterior coil array 20 and a posterior coil array 22. In an exemplary embodiment, the leg section 10 is disposed at a leg 28 such that the anterior coil array 20 is proximate to an anterior portion of the leg 28 and the posterior coil array 22 is proximate to a posterior portion of the leg 28. In other words, the posterior coil array 22 and the anterior coil array 20 are disposed at opposite sides of the leg 28 to face each other as shown in FIG. 2. In an exemplary embodiment, the anterior and posterior coil arrays 20 and 22 extend from near a knee region 29 of the leg 28 to near an ankle region 31. It should be noted that although in this exemplary embodiment, the leg section 10 includes the anterior and posterior coil arrays 20 and 22 disposed proximate to anterior and posterior portions of the leg 28, respectively, any arrangement of two coil arrays disposed opposite to each other across a ROI is envisioned.

As shown in FIG. 1, when a patient lies, for example, on an examining table, the leg 28 is extended in a first direction 30, while a foot 32 is extended in a second direction 34 that is substantially perpendicular to the first direction 30.

Figure 3:
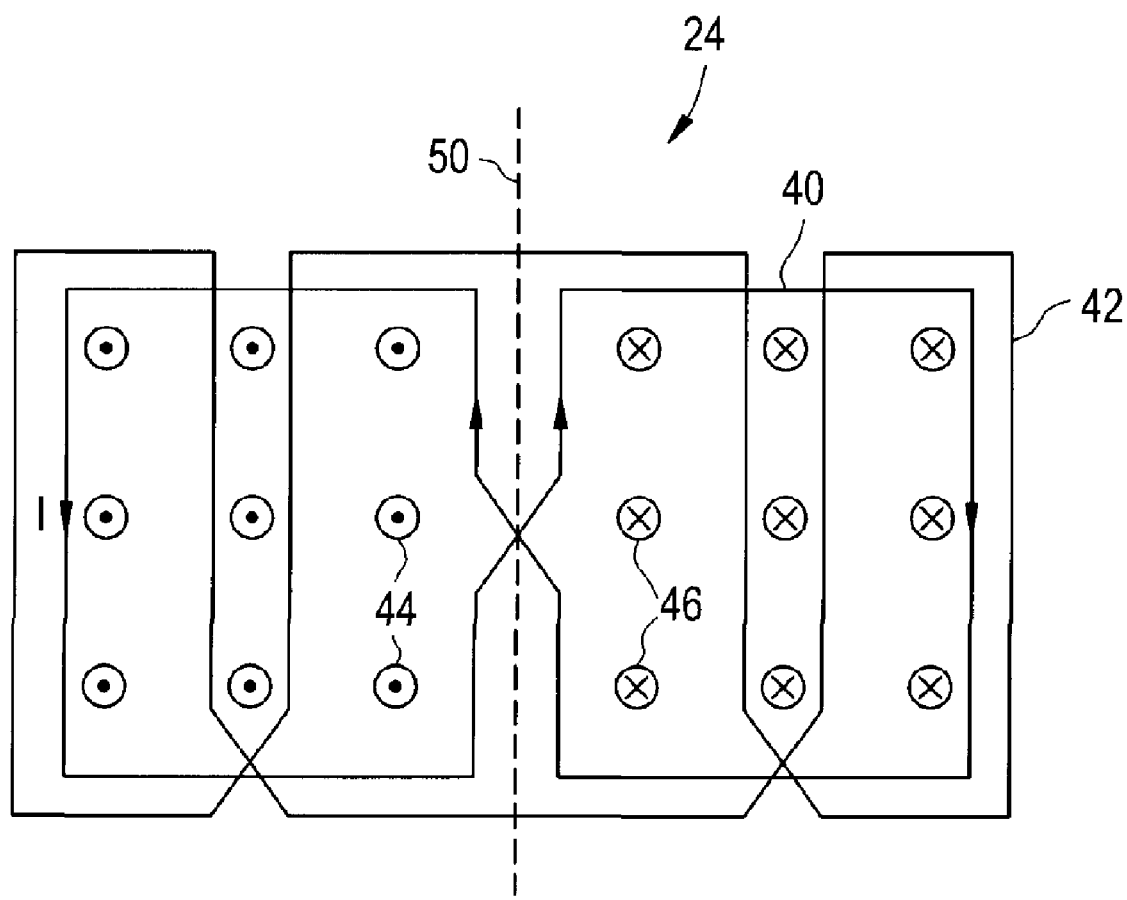
FIG. 3 is a schematic view of a portion of a foot portion of a high resolution peripheral vascular coil array according to an exemplary embodiment.

Both anterior and posterior coil arrays 20 and 22 include at least a loop coil (see FIG. 7, for example, elements 52, 54, 56, 70, 72, 74 and 76) and a butterfly coil (see FIG. 3, for example, element 40). The loop coil and the butterfly coil are depicted generally as coil elements 23 that form a single quadrature coil. Magnetic decoupling between adjacent coil elements 23 may be achieved, for example, by using a critical overlap technique described in U.S. Pat. No. 4,825,162. For example, decoupling may be achieved by arranging the loop coil and the butterfly coil to share the same axis of geometrical symmetry. In other words, the loop coil and the butterfly coil are decoupled via utilization of "orthogonality" between the loop coil and the butterfly coil. In an exemplary embodiment, decoupling between "non-orthogonal" coils is achieved using a capacitive decoupling network 38 (see FIG. 7). Decoupling between non-adjacent coil elements 23 is achieved via integration of a low input impedance preamplifier on each coil element. Additionally, anterior and posterior coil arrays 20 and 22 are arranged such that they do not overlap each other as shown in FIG. 2.

The foot section 12 includes a foot coil array 24. In an exemplary embodiment, the foot coil array 24 is disposed proximate to a foot such that opposite ends of the foot coil array 24 are extended over a top portion of a foot 32 in a direction substantially perpendicular to a longitudinal direction of the foot 32. The foot coil array 24 substantially covers from near a toe portion to the ankle region 31 of the foot 32 and is wrapped around the top portion of the foot 32 such that opposite ends of the foot coil array 24 face each other across a ROI that includes the foot 32.

Figure 4:
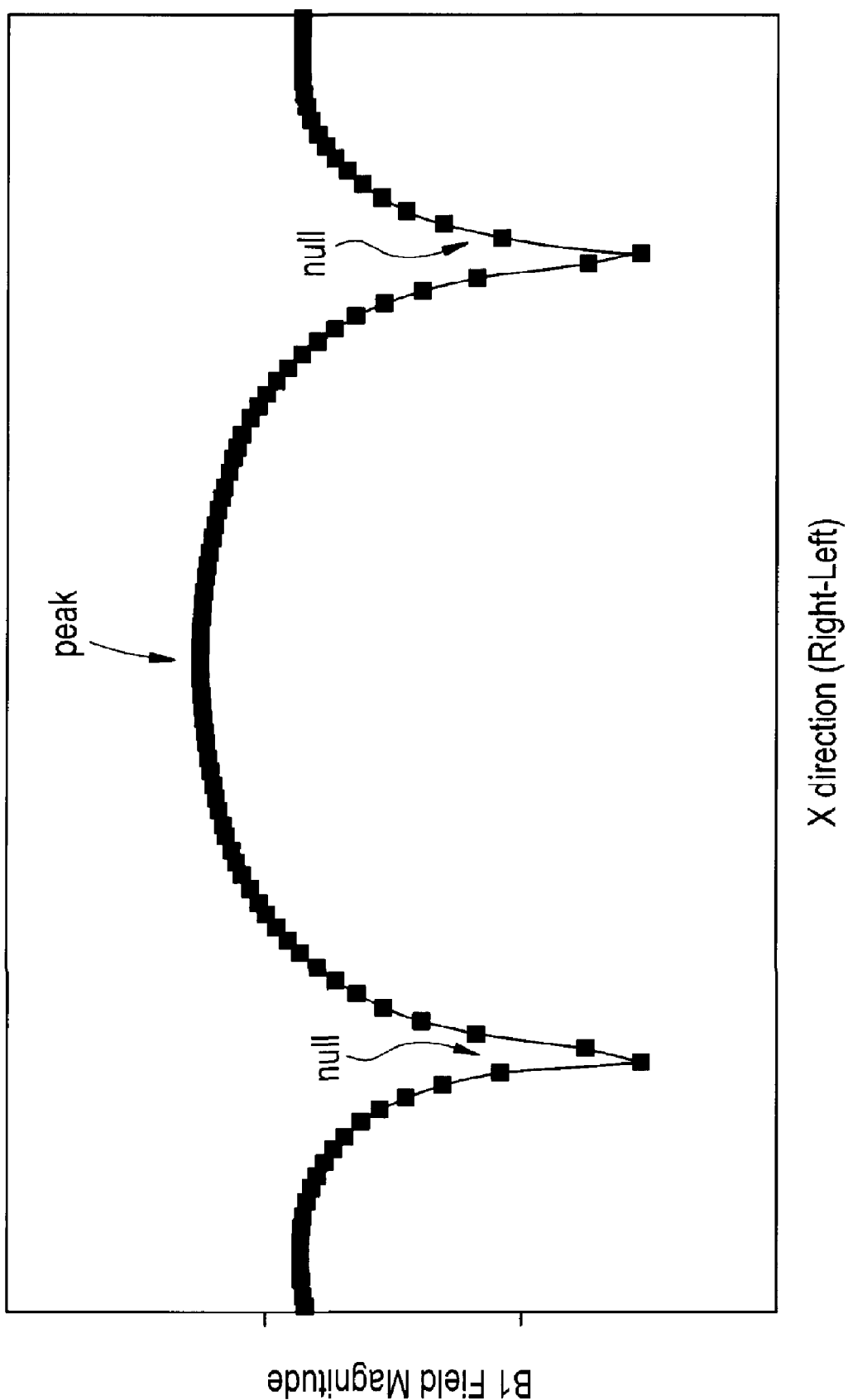
FIG. 4 is a diagram of a magnetic field B1 of a butterfly coil when disposed at a foot of a patient.
Figure 5:
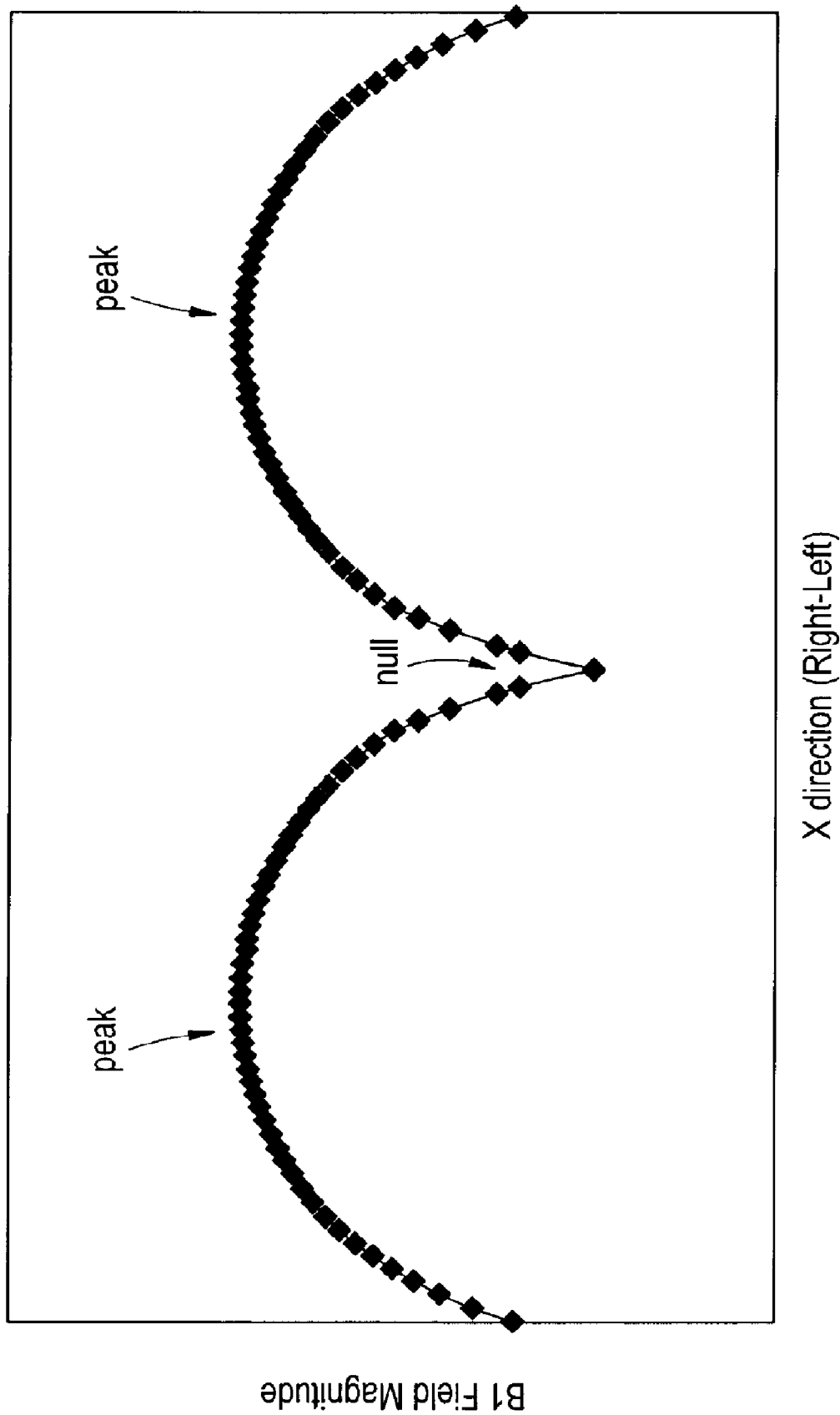
FIG. 5 is a diagram of a magnetic field B1' of a double butterfly coil when disposed at a foot of a patient.
Figure 6:
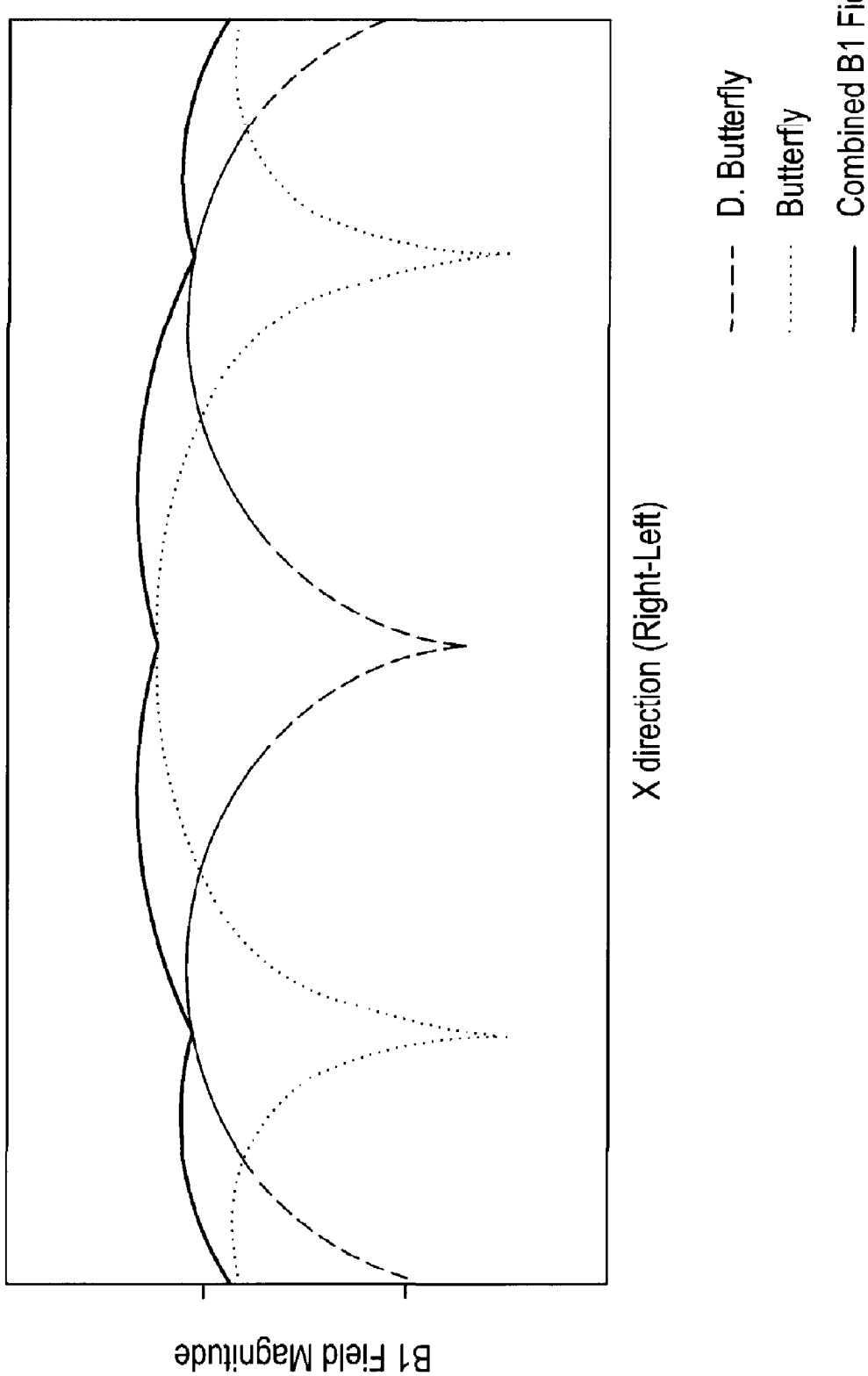
FIG. 6 is a diagram of a combined magnetic field B1" of the butterfly and the double butterfly coil when disposed at a foot of a patient.

FIG. 3 is a schematic view of a portion of a foot section 12 of a high resolution peripheral vascular coil array according to an exemplary embodiment. As shown in FIG. 3, the foot coil array 24 includes a butterfly coil 40 and a double butterfly coil 42. The butterfly and double butterfly coils 40 and 42 are arranged concentrically as shown in FIG. 3. Since the foot 32 lies in the second direction 34, as shown in FIG. 1, a magnetic field B1 formed by only the butterfly coil 40 is shown in FIG. 4. Arrow tips 44 and arrow tails 46 in FIG. 3 show the direction of the magnetic field B1. The magnetic field B1 travels in a direction from arrow tails 46 to corresponding arrow tips 44 in response to a current I in the butterfly coil 40. The magnetic field B1 of FIG. 4 has two null regions wherein resolution of images is poor. The two null regions are disposed such that each null is on an opposite side of a center of a ROI being examined. FIG. 5 shows the magnetic field B1' formed by only the double butterfly coil 42. Magnetic field B1' has a single null disposed at a center of the ROI being examined. FIG. 6 shows a combined magnetic field B" formed by disposing the butterfly and double butterfly coils 40 and 42 concentrically as shown in FIG. 3. Thus, by disposing the butterfly and double butterfly coils 40 and 42 concentrically, the combined magnetic field B" produced eliminates null regions having poor resolution.

In addition, since the butterfly coil 40 always generates a symmetric magnetic field about an axis 50, when the double butterfly coil 42 shares the axis 50, a net magnetic flux is zero and magnetic decoupling is inherently achieved. Inherent magnetic coupling allows the butterfly and double butterfly coils 40 and 42 to be used simultaneously to improve signal-to-noise ratio (SNR) and coverage of the foot coil array 24 over conventional imaging apparatuses.

Figure 7:
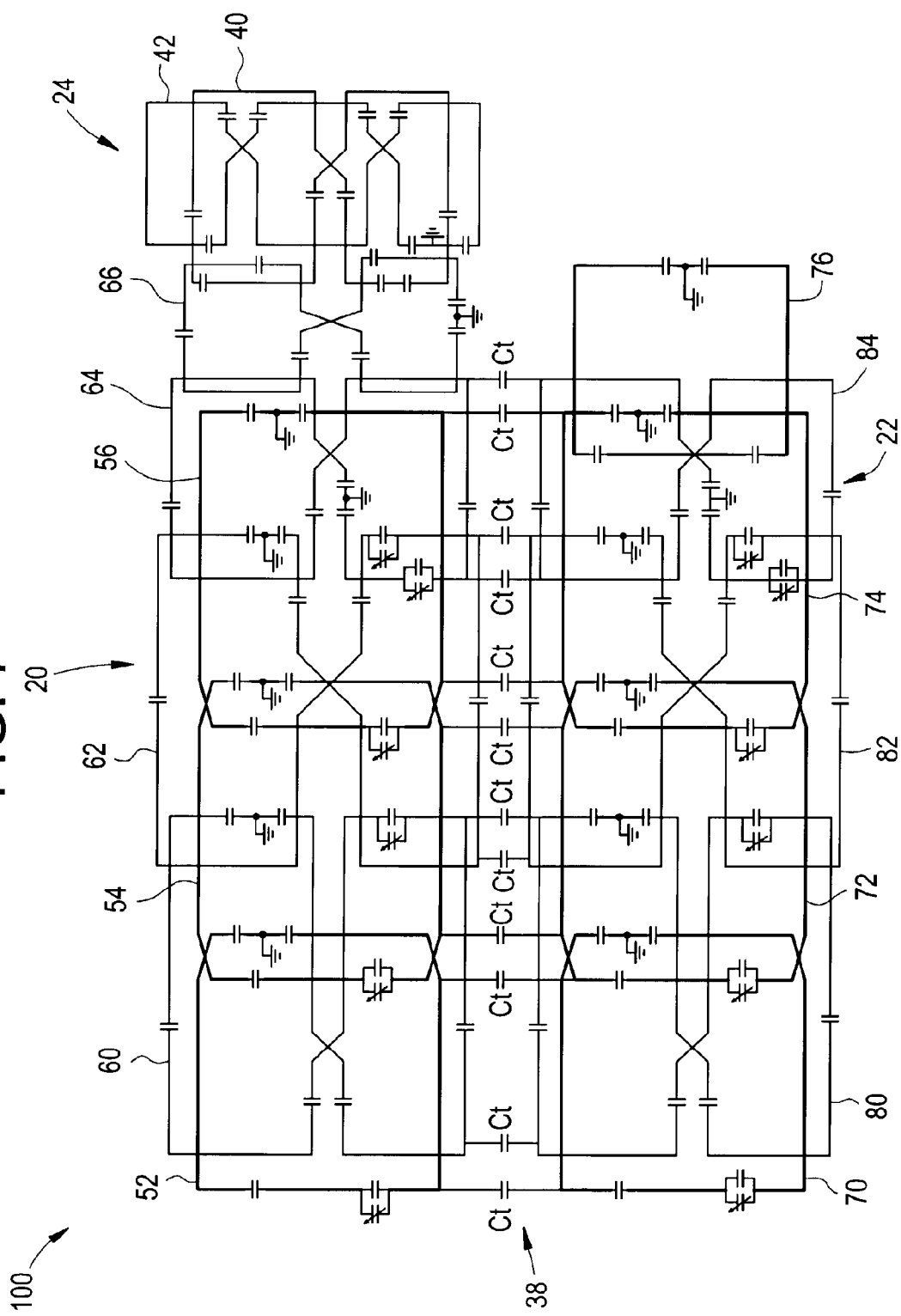
FIG. 7 is a schematic diagram of a high resolution peripheral vascular coil array according to an exemplary embodiment.

In an exemplary embodiment, the foot coil array 24 further includes an ankle butterfly coil 66 (see FIG. 7). The ankle butterfly coil 66 is overlapped with a portion of the concentrically disposed butterfly coil 40 and double butterfly coil 42 of the foot coil array 24, and the anterior coil array 20 in order to allow high resolution imaging from the knee region 29 to the toe portion of the foot 32.

FIG. 7 is a schematic diagram of a high resolution peripheral vascular coil array according to an exemplary embodiment. The peripheral vascular coil array 100 shown is for one leg 28, but it should be understood that a substantially identical second coil array (not shown) may be simultaneously employed on a second leg (not shown). The peripheral vascular coil array 100 according to this exemplary embodiment includes the anterior coil array 20, the posterior coil array 22, the foot coil array 24, and the capacitive decoupling network 38.

The anterior coil array 20 includes a first anterior loop coil 52, a second anterior loop coil 54 and a third anterior loop coil 56. The anterior coil array 20 also includes a first anterior butterfly coil 60, a second anterior butterfly coil 62 and a third anterior butterfly coil 64. The posterior coil array 22 includes a first posterior loop coil 70, a second posterior loop coil 72, a third posterior loop coil 74 and a fourth posterior loop coil 76. The posterior coil array 22 also includes a first posterior butterfly coil 80, a second posterior butterfly coil 82 and a third posterior butterfly coil 84. The foot coil array 24 includes the butterfly coil 40, the double butterfly coil 42 and the ankle butterfly coil 66. The capacitive decoupling network 38 includes a plurality of capacitors Ct that decouple non-orthogonal coils as described above.

In an exemplary embodiment as shown in FIG. 7, adjacent loop and butterfly coils are overlapped to provide an overlapping of regions that may be imaged. Thus, the peripheral vascular coil array 100 produces a continuous image of the leg 28 and foot 32 extending from the toe region to a knee region 29 of the leg 28. Thus, the peripheral vascular coil array 100 according to this exemplary embodiment includes 16 elements, or 16 channels, thereby providing improved resolution of lower limb images by forming a volume phased array wherein concentric elements each contribute an optimal magnetic field to a same voxel disposed in the ROI.

The peripheral vascular coil array 100 may include a larger or smaller number of elements or channels in response to needs presented by a given situation. Additionally, the peripheral vascular coil array 100 may be mounted in conjunction with a support apparatus 90 such as that shown in FIG. 8. The support apparatus 90 according to an exemplary embodiment is configured to retain each of the anterior coil array 20, the posterior coil array 22 and the foot coil array 24. The support apparatus 90 may, for example, be parted along an opening between the anterior coil array 20 and the posterior coil array 22 to allow insertion of the leg 28. Furthermore, the support apparatus 90 is configured to be rigid and adjustable in size such that the support apparatus 90 is not compressive to the leg 28.

Figure 8:
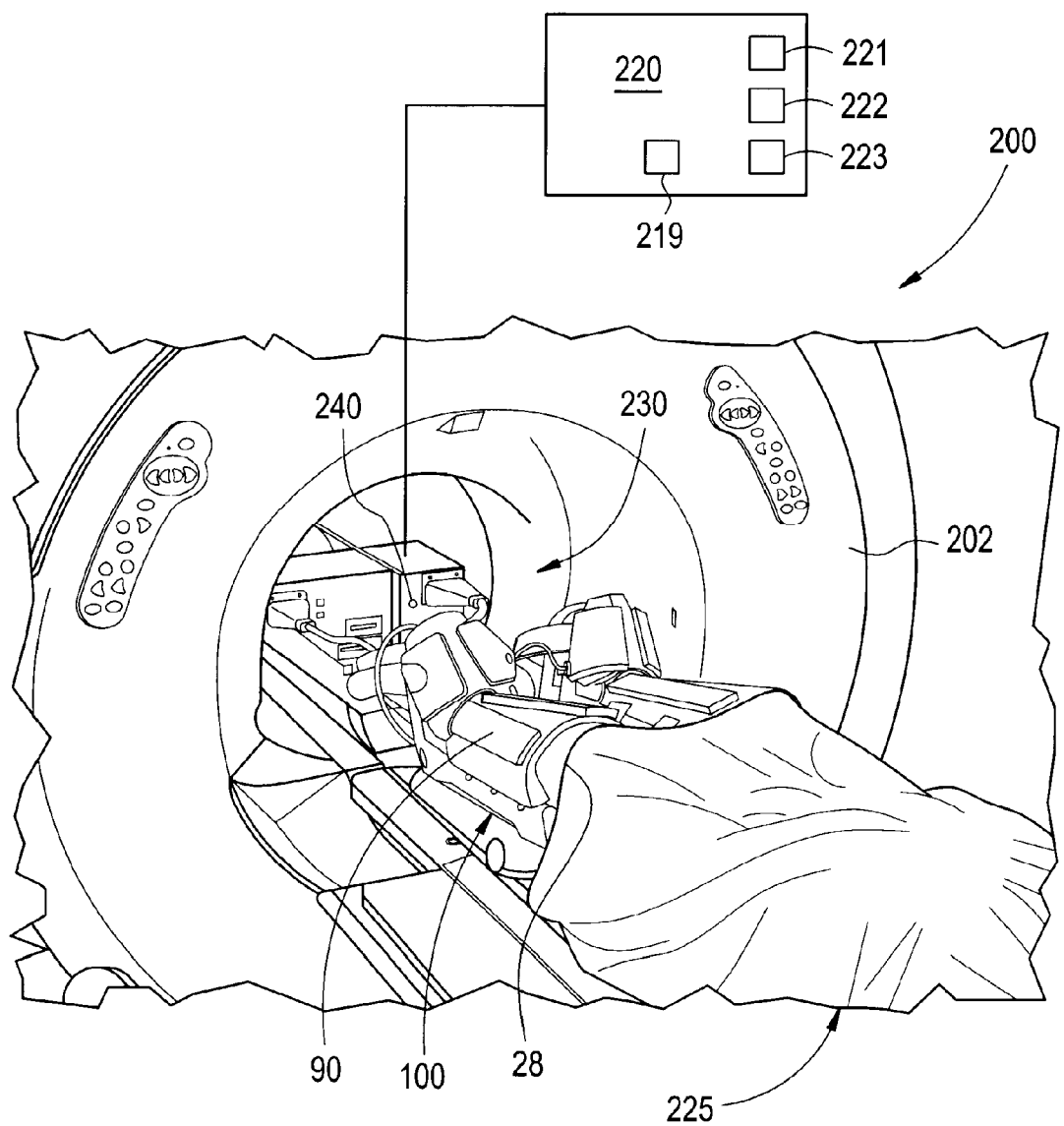
FIG. 8 is a perspective view of a magnetic resonance imaging system including a high resolution peripheral vascular coil array according to an exemplary embodiment.

FIG. 8 depicts an exemplary embodiment of an MRI system 200 having a magnetic field generating apparatus 202 and a control system 220 for the control and operation thereof. The magnetic field generating apparatus 202 is annular shaped and includes a bore 230 for inserting a person 225 or other imaging object for MRI diagnostics under the control of control system 220. In an exemplary embodiment, control system 220 includes x, y and z-axis gradient magnetic field power supplies 221 for powering field generating apparatus 202, an RF coil amplifier 219, transmit and receive circuitry 222 for controlling the RF pulses, and a computer system 223 for overall control and for processing and displaying the nuclear magnetic resonance signals. The control system 220 is electrically connected to the peripheral vascular coil array 100 disposed with the support apparatus 90 via an interface device 240.

In addition, while the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A peripheral vascular coil array for providing images of a region of interest, the coil array comprising:
    a first section including a first coil array and a second coil array in electrical communication with each other and disposed at opposite sides of the region of interest to produce a magnetic field in the region of interest, each of the first and second coil arrays comprising a butterfly coil and a loop coil; and
    a second section in operable communication with the first section, the second section including a first butterfly coil and a double butterfly coil arranged concentrically, the double butterfly coil having a conductive path defining three sets of loops;
    wherein in response to a current through the first butterfly coil, a first magnetic field is formed having two null regions, each null region disposed on an opposite side of a center of the region of interest;
    wherein in response to a current through the double butterfly coil, a second magnetic field is formed having one null region disposed at the center of the region of interest.

2. The peripheral vascular coil array of claim 1, wherein the second section is disposed proximate to a foot such that opposite end portions of the second section face each other across the foot to produce a magnetic field in the foot.

3. The peripheral vascular coil array of claim 1, wherein the first butterfly coil and the double butterfly coil are inherently decoupled.

4. The peripheral vascular coil array of claim 1, wherein the first section includes the first coil array disposed proximate to an anterior portion of a leg and the second coil array disposed proximate to a posterior portion of the leg.

5. The peripheral vascular coil array of claim 1, wherein:
    each of the first and second coil arrays includes a plurality of loop coils and a plurality of butterfly coils;
    each loop coil of the plurality of loop coils is disposed to structurally overlap at least one loop coil and at least one butterfly coil; and
    each butterfly coil of the plurality of butterfly coils is disposed to structurally overlap at least one loop coil and at least one butterfly coil.

6. The peripheral vascular coil array of claim 1, wherein the first coil array includes three loop coils and three butterfly coils.

7. The peripheral vascular coil array of claim 1, wherein the second coil array includes four loop coils and three butterfly coils.

8. The peripheral vascular coil array of claim 1, wherein the coil array includes a capacitive decoupling network disposed electrically between the first and second coil arrays.

9. The peripheral vascular coil array of claim 1, wherein the first and second sections are mounted on a rigid support apparatus.

10. The peripheral vascular coil array of claim 9, wherein the rigid support apparatus non-compressively receives a portion of an object containing the region of interest.

11. A peripheral vascular coil array for providing images of a region of interest, the coil array comprising:
    a first section including a first coil array and a second coil array in electrical communication with each other and disposed at opposite sides of the region of interest to produce a magnetic field in the region of interest, each of the first and second coil arrays comprising a butterfly coil and a loop coil; and
    a second section in operable communication with the first section, the second section including a first butterfly coil and a double butterfly coil arranged concentrically, the double butterfly coil having a conductive path defining three sets of loops;
    wherein the second section further comprises a second butterfly coil disposed to overlap both the first section and the first butterfly coil and the double butterfly coil arranged concentrically.

12. An imaging system for providing images of a region of interest comprising:
    a control system;
    a magnetic field generating apparatus which generates magnetic field in response to the control system;
    a peripheral vascular coil array comprising:
    a first section including a first coil array and a second coil array in electrical communication with each other and disposed at opposite sides of the region of interest to produce a magnetic held in the region of interest, each of the first and second coil arrays comprising a butterfly coil and a loop coil;
    a second section in operable communication with the first section, the second section including a first butterfly coil and a double butterfly coil arranged concentrically, the double butterfly coil having a conductive path defining three sets of loops; and
    an interface device providing electrical communication between the peripheral vascular coil array and the control system;
    wherein in response to a current through the first butterfly coil, a first magnetic field is formed having two null regions, each null region disposed on an opposite side of a center of the region of interest; and wherein in response to a current through the double butterfly coil, a second magnetic field is formed having one null region disposed at the center of the region of interest.

13. The imaging system of claim 12, wherein the second section is disposed proximate to a foot such that opposite end portions of the second section face each other across the foot to produce a magnetic field in the foot.

14. The imaging system of claim 12, wherein the second section further comprises a second butterfly coil disposed to overlap both the first section and the first butterfly coil and the double butterfly coil arranged concentrically.

15. The imaging system of claim 12, wherein the first section includes the first coil array disposed proximate to an anterior portion of a leg and the second coil array disposed proximate to a posterior portion of the leg.

16. The imaging system of claim 12, wherein:

each of the first and second coil arrays includes a plurality of loop coils and a plurality of butterfly coils;

each loop coil of the plurality of loop coils is disposed to structurally overlap at least one loop coil and at least one butterfly coil; and each butterfly coil of the plurality of butterfly coils is disposed to structurally overlap at least one loop coil and at least one butterfly coil.

17. The imaging system of claim 12, wherein the first and second sections are mounted on a rigid support apparatus configured to non-compressively receive a portion of an object containing the region of interest.

18. The imaging system of claim 12, wherein the first coil array includes three loop coils and three butterfly coils and the second coil array includes four loop coils and three butterfly coils.

* * * * *